United States Patent
Correale, Jr. et al.

(10) Patent No.: US 7,089,510 B2
(45) Date of Patent: Aug. 8, 2006

(54) METHOD AND PROGRAM PRODUCT OF LEVEL CONVERTER OPTIMIZATION

(75) Inventors: Anthony Correale, Jr., Raleigh, NC (US); David S. Kung, Chappaqua, NY (US); Douglass T. Lamb, Cary, NC (US); Zhigang Pan, Austin, TX (US); Ruchir Puri, Peekskill, NY (US)

(73) Assignee: International Business Machines Corp., Armonk, NY (US)

( * ) Notice: Subject to any disclaimer, the term of this patent is extended or adjusted under 35 U.S.C. 154(b) by 303 days.

(21) Appl. No.: 10/720,562

(22) Filed: Nov. 24, 2003

(65) Prior Publication Data

US 2005/0114815 A1  May 26, 2005

(51) Int. Cl.
*G06F 17/50* (2006.01)
(52) U.S. Cl. .................. 716/2; 716/6; 716/10
(58) Field of Classification Search .............. None
See application file for complete search history.

(56) References Cited

U.S. PATENT DOCUMENTS

| 5,517,132 | A | * | 5/1996 | Ohara ............... 326/41 |
| 5,594,368 | A | | 1/1997 | Usami |
| 5,818,256 | A | | 10/1998 | Usami |
| 5,990,706 | A | * | 11/1999 | Matsumoto et al. ...... 326/98 |
| 6,167,554 | A | * | 12/2000 | Ishikawa et al. ......... 716/1 |
| 6,266,798 | B1 | * | 7/2001 | Kanazawa et al. ........ 716/4 |
| 6,941,534 | B1 | * | 9/2005 | Fukasawa .............. 716/8 |

OTHER PUBLICATIONS

Chen et al., "On Gate Level Power Optimization Using Dual-Supply Voltages," IEEE Trans. on VLSI Systems, vol. 9, No. 5, Oct. 2001, pp. 616-629.*
Hamada et al., "A Top-Down Low Power Design Technique Using Clustered Voltage Scaling with Variable Supply-Voltage Scheme," IEEE 1998 Custom ICs Conference, pp. 495-498.*
Igarashi et al., "A Low-power Design Method Using Multiple Supply Voltages," 1997 ACM, pp. 36-41.*
Ishihara et al., "Lecel Conversion for Dual-Supply Systems," ISLPED '-3, Aug. 25-27, 2003, pp. 164-167.*

(Continued)

*Primary Examiner*—Leigh M. Garbowski
(74) *Attorney, Agent, or Firm*—Law Office of Charles W. Peterson, Jr.; Louis J. Percello, Esq.; Satheesh K. Karra, Esq.

(57) ABSTRACT

A method and program product for optimizing level converter placement in a multi supply integrated circuit. Each level converter is placed at a minimum power point to minimize net power and transitional delay from a first (low) voltage net source through the level converter and to a second (higher) voltage net sink. Then, inefficient level converters are eliminated. Level converters with fanin cones below a selected minimum cone size are deleted and low voltage sources to the deleted level converter reverted. Higher voltage level circuit elements receiving inputs from multiple level converters are replaced with equivalent low voltage circuit elements. Low voltage buffer driving level converters are both replaced by a single said level converter.

38 Claims, 10 Drawing Sheets

OTHER PUBLICATIONS

Kang et al., "Multiple-Vdd Scheduling/Allocation for Partitioned Floorplan," Proc. of the 21st Int'l Conference on Computer Design, 2003, 7 pages.*

Pangjun et al., "Clock Distribution Using Multiple Voltages," ISLPED99, ACM 1999, pp. 145-150.*

Usami et al., "Low-power Design Methodology and Applications utilizing Dual Supply Voltages," 2000 IEEE, pp. 123-128.*

Yeh et al., "Layout Techniques Supporting the Use of Dual Supply Voltages for Cell-Based Designs," 1999 ACM Design Automation Conference, 6 pages.*

Lackey et al., Managing power and performance for System-on-Chip designs using Voltage Islands, Proceedings of the 2002 IEEE/ACM international conference on Computer-aided design, Nov. 11, 2002, pp. 195-202.

Usami et al., Clustered Voltage Scaling Techniques for Low-Power Design, International Low Symposium on Low-Power Electronic Design, Apr. 1, 1995, pp. 3-8, Publisher: ACM Press.

Usami et al., Automated Low-Power Technique Exploiting Multiple Supply Voltages Applied To A Media Processor, IEEE Journal of Solid-State Circuits, Mar. 1, 1998, pp. 463-472, vol. 33, No. 3.

Yeh et al., Layout Techniques Supporting The Use of Dual Supply Voltages for Cell-Based Designs, Proc. ACM/IEEE Design Auto. Conf., Jun. 1, 1999, pp. 62-67.

* cited by examiner

METHOD AND PROGRAM PRODUCT OF LEVEL CONVERTER OPTIMIZATION

CROSS REFERENCE TO RELATED APPLICATION

The present invention is related to U.S. application Ser. No. 10/720,464 entitled "MULTIPLE VOLTAGE INTEGRATED CIRCUIT AND DESIGN METHOD THEREFOR" to Anthony Correale Jr. et al., U.S. application Ser. No. 10/720,466 entitled "SINGLE SUPPLY LEVEL CONVERTER" to Anthony Correale Jr. et al., both filed coincident herewith and to U.S. application Ser. No. 10/387,728 entitled "VOLTAGE ISLAND CIRCUIT PLACEMENT" to Anthony Correale Jr., filed Mar. 13, 2003, all assigned to the assignee of the present invention.

BACKGROUND OF THE INVENTION

1. Field of the Invention

The present invention is related to integrated circuit (IC) design circuit design and more particularly, to optimizing standard cell design configurations.

2. Background Description

Semiconductor technology and chip manufacturing advances have resulted in a steady increase of on-chip clock frequencies, the number of transistors on a single chip and the die size itself, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, must be achieved without degrading performance below acceptable levels. Consequently, power consumption has been a major design consideration for designing very large scale integrated circuits (VLSI) such as high performance microprocessors. In particular, increasing power requirements run counter to the low end design goal of longer battery life. Since chip power is directly proportion to the square of supply voltage ($V_{dd}$), reducing supply voltage is one of the most effective ways to reduce the power consumption, both active and standby (leakage) power, which is becoming more and more of a problem as technology features scale into nanometer (nm) dimension range.

While reducing supply voltage is attractive to reduce the power consumption, reducing $V_{dd}$ increases transistor and gate delay. Thus, for a design that is performance constrained, the supply voltage may not be lowered too much and, it is usually determined by the most timing critical paths. However, it is often the case that most cells in a chip are timing non-critical. If those timing non-critical cells are properly selected to be on lower supply voltage(s), significant power saving may be achieved without degrading the overall circuit performance.

One approach to reducing power is to use multiple supply voltages each supplying different circuit blocks or voltage islands. Each voltage island runs at its minimum necessary supply voltage. However, multiple supply voltages on the same circuit/chip present numerous problems, especially for deep submicron (DSM) designs, where circuit performance often is dominated by interconnect delays. In particular, logic synthesis is very complicated for multiple supply designs and, placement and routing must be considered together for voltage assignment, level converter insertion and minimization, and for circuit block clustering to simplify power routing of multiple supply lines.

Thus, there is a need for circuit element clustering for minimum power and to simplify power routing of multiple supply lines.

SUMMARY OF THE INVENTION

It is a purpose of the invention to improve integrated circuit (IC) chip design;

It is another purpose of the invention to improve cell placement in multi supply voltage IC chip designs;

It is yet another purpose of the invention to improve cell placement of first supply voltage cells with cells of other supply voltages in multi supply voltage IC chip designs;

It is yet another purpose of the invention to group circuit cells in a multi-supply design close to their respective power supplies;

It is yet another purpose of the invention to group circuit cells in a multi-supply design to facilitate timing closure;

It is yet another purpose of the invention to group circuit cells in a multi-supply design for optimum level converter placement;

It is yet another purpose of the invention to group circuit cells in a multi-supply design for a minimum number of level converters;

It is yet another purpose of the invention to group circuit cells in a multi-supply design for efficient level converter placement.

The present invention relates to a method and program product for optimizing level converter placement in a multi supply integrated circuit. Each level converter is placed at a minimum power point to minimize net power and transitional delay from a first (low) voltage net source through the level converter and to a second (higher) voltage net sink. Then, inefficient level converters are eliminated. Level converters with fanin cones below a selected minimum cone size are deleted and low voltage sources to the deleted level converter reverted. Higher voltage level circuit elements receiving inputs from multiple level converters are replaced with equivalent low voltage circuit elements. Low voltage buffer driving level converters are both replaced by a single said level converter.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Accordingly, as described hereinbelow, the present invention provides a versatile and generic multi-supply voltage island circuit structure, wherein different supply voltages are assigned at both macro and cell level within the islands. Unless indicated otherwise for simplicity of discussion hereinbelow, logic cell and gate are used interchangeably and each is a sub-circuit of standard cell design. Further, a standard cell design is taken as having the same height, i.e., row height, for most cells. Abutting cells form circuit rows. Also, typical modern application specific integrated circuit (ASIC) and system on a chip (SOC) designs often have many proprietary macros (known in the art as intellectual property (IP) blocks) mixed with standard cells. A voltage island can be a single cell, an IP block or macro or, a continuous region of cells on the same or adjacent rows that have the same power supply voltage (referred to herein as a high voltage supply or $V_{ddh}$ and a low voltage supply or $V_{ddl}$). An output or source drives a net connecting one or more inputs or sinks to the source and a low/high voltage net connects a low/high voltage source to low/high voltage sinks. Also, although described herein in terms of two (2) supplies description, this is for example only and not intended as a limitation. A person skilled in the art would readily understand how to extended the 2 supply description to multiple supply voltages.

Figure 1A:
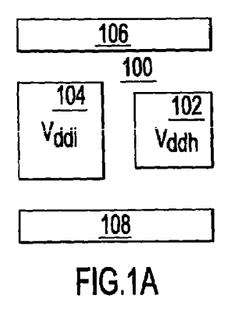
FIGS. 1A–C show different state of the art circuit layouts for multi-supply chips.
Figure 1B:
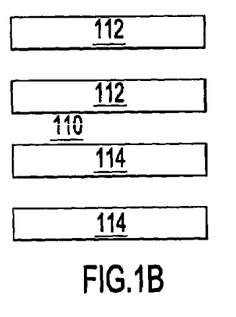
Figure 1C:
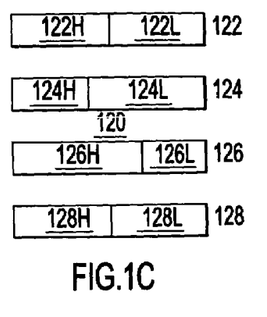

So, FIGS. 1A–C show different state of the art multi-supply chips with examples of well known circuit island placement, e.g., as described in D. E. Lackey et al., "Managing power and performance for system-on-chip designs using voltage islands", in *Proc. International Conference on Computer Aided Design*, pp. 195–202, November, 2002. In the example 100 of FIG. 1A, voltage islands are only allowed at the macro level 102, 104, with no fine-grained voltage assignment for cells 106, 108. For deep submicron (DSM) designs, which have tight performance targets, it may not be possible to switch an entire macro between a normal and a lower supply voltage without incurring an overall circuit performance loss. So it would be more flexible if voltage assignment can be done at cell level to exploit positive slacks. The example of FIG. 1B shows a circuit block 110 with cell level voltage assignment, but at the cost of a restricting the layout to alternating or interleaving pairs of high and low supply rows 112, 114. FIG. 1C shows another example 120, somewhat unconstrained by the requirement of interleaving entire rows. Instead, in this example each row 122, 124, 126, 128 may have two areas with different voltages (designated H or L), provided each area occupies either the left or right part of the row. Unfortunately, these voltage island patterns or segregated voltage areas unnaturally constrain voltage assignment and/or reduce placement flexibility. Frequently in a typical modern ASIC/SOC design, non-critical regions are interspersed with critical regions in the same circuit row. Typically available such circuit structures are not flexible enough to allow circuit placement or voltage island granularity sufficient to meet stringent delay constraints or, in placing to meet such constraints introduce routing problems.

By contrast, a preferred circuit and chip design method incorporates generic voltage islands with much finer layout granularity. Supply voltage assignment may be done at both macro and gate level, affording designers much more design freedom and providing a much more flexible voltage island layout structure. Further such a preferred embodiment design achieves timing closure on design timing goals during voltage island formation and hastens timing optimization.

Figure 2:
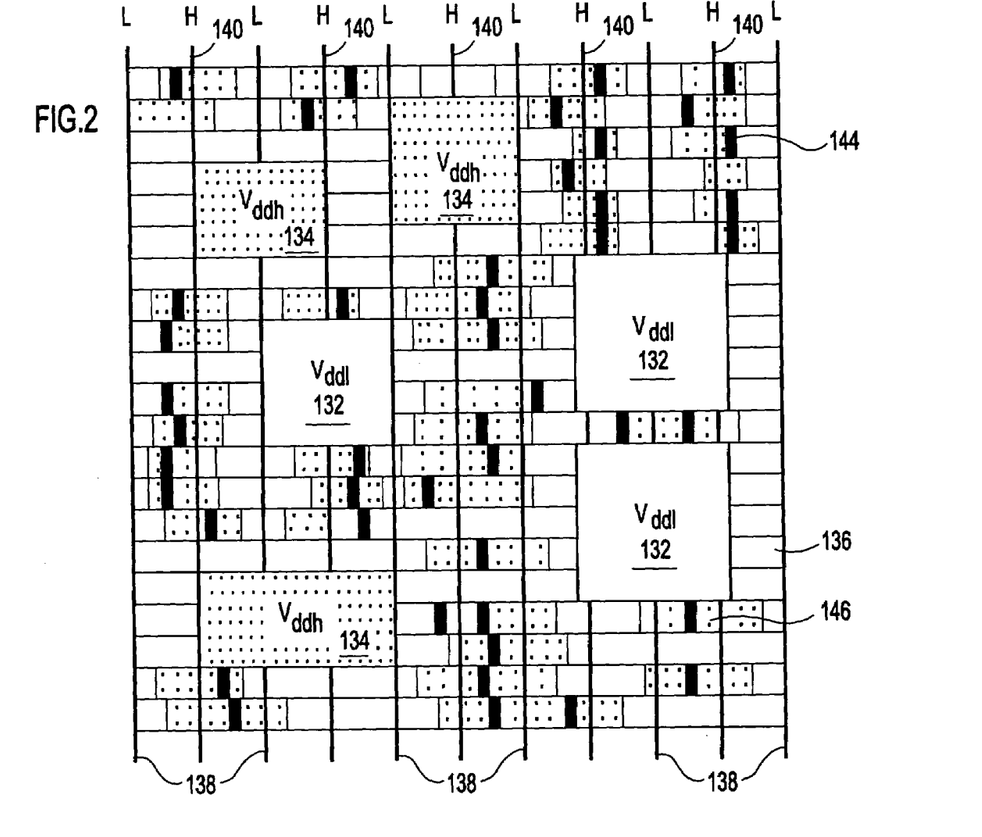
FIG. 2 shows an example of a generic voltage island structure formed according to a preferred embodiment of the present invention.

FIG. 2 shows an example of a generic voltage island structure 130 formed according to a preferred embodiment of the present invention, wherein different voltages are assigned at both macro and cell levels. Preferred voltage assignment affords more freedom in terms of layout style by allowing multiple voltage islands within the same circuit row. Further, such a pattern 130 is achievable with minimum disturbance to an existing placement, i.e., after normal chip design and placement. So, after designing and placing circuits for performance, for example, the design may be modified according to the present invention, selectively replacing higher power ($V_{ddh}$) circuits (stippled) with lower power ($V_{ddl}$) circuits (clear) where possible. Since some gap may be needed between adjacent $V_{ddl}$ islands 132 and $V_{ddh}$ islands 134 (depending on the standard cell library), a minimum or maximum allowed cluster size or number of voltage islands may be specified for each circuit row, e.g., 136, based on the particular user or technology specification. See, for example, U.S. application Ser. No. 10/387,728 entitled "VOLTAGE ISLAND CIRCUIT PLACEMENT" to Anthony Correale Jr., filed Mar. 13, 2003, assigned to the assignee of the present invention and incorporated herein by reference. To facilitate power routing, a power grid structure of VDDL 138 and VDDH 140 is co-designed with the voltage island assignment.

Typically, a $V_{ddl}$ source cannot drive a $V_{ddh}$ sink reliably without excessive leakage. Thus, a level converter is needed for a transition from a low voltage net to a high voltage net. Traditional level converters require both supply voltages, $V_{ddl}$ and $V_{ddh}$, to avoid excessive leakage. Previously, using dual-supply voltage level converters 144, required that they be placed at the island 132, 134 boundaries for access to both power supplies. However, a single-supply level converter is used such as is described in U.S. application Ser. No. 10/720,466 entitled "SINGLE SUPPLY LEVEL CONVERTER" to Anthony Correale Jr. et al., filed coincident herewith and incorporated herein by reference. Correale Jr. et al. level converters 142 can be placed anywhere in a higher voltage island 134 or logic 146 and so, provide additional placement flexibility. Preferably, a level converters as described hereinbelow is a single supply level converter such as Correale Jr. et al.

Figure 3:
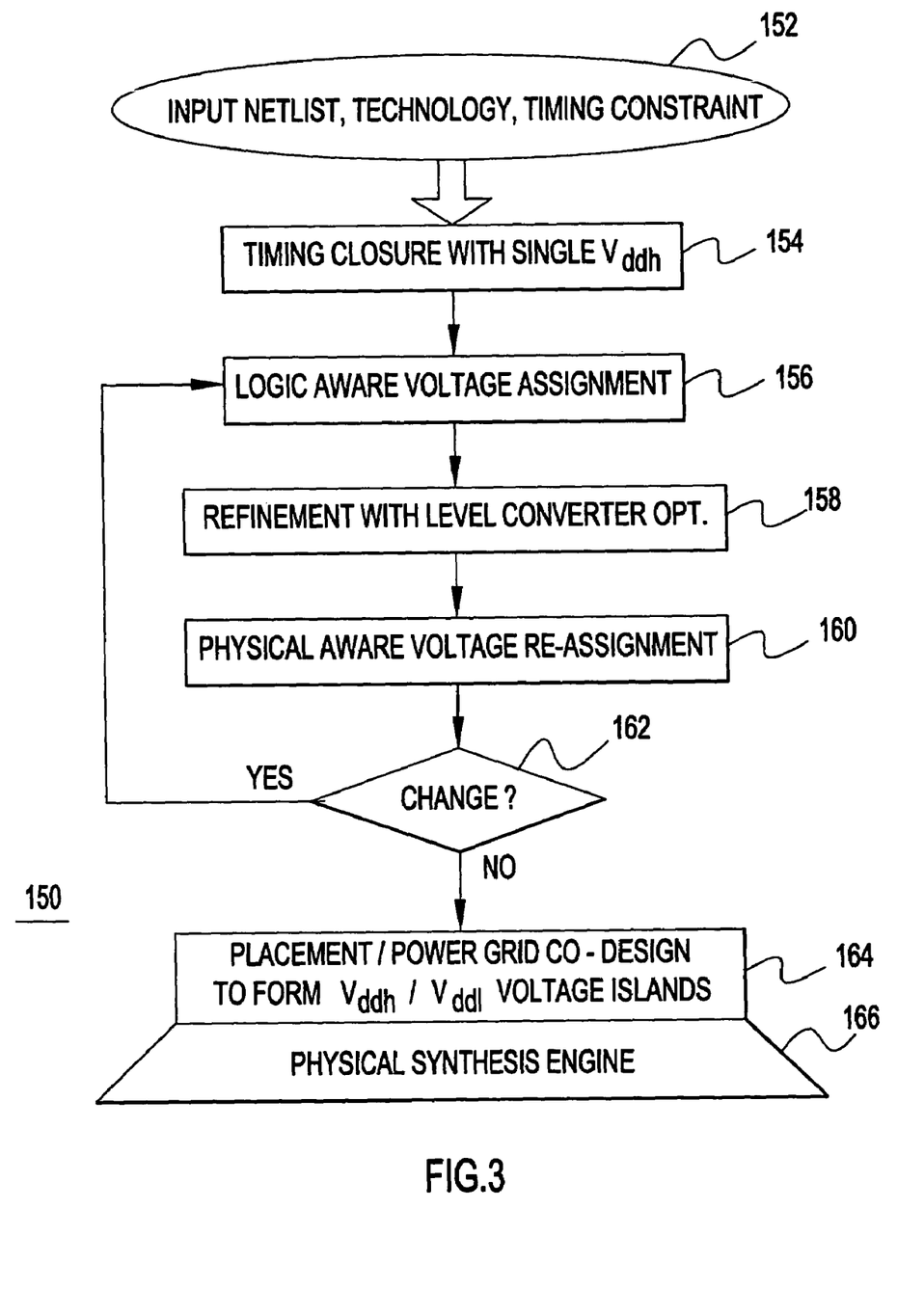
FIG. 3 shows an example of a flowchart of a method of generic voltage island optimization for low power with rapid timing closure according to a preferred embodiment of the present invention.

FIG. 3 shows an example of a flowchart 150 of a method of generic voltage island optimization for low power with rapid timing closure according to a preferred embodiment of the present invention. For deep submicron (DSM) designs, interconnect delay can dominate the transistor delay, thus placement (and even routing) information are used to get an accurate timing estimation.

So, beginning in step 152 an input netlist description and specifications (e.g., technology files and timing constraints) is provided. In step 154 a timing closure tool with Spice RC delays (e.g., a suitable tool from Synopsis, Inc., or EinsTimer from IBM Corporation) is used to determine the entire circuit/chip timing at the higher supply voltage ($V_{ddh}$) for a base placement and optimization, i.e., determining global placement and obtaining a good timing estimation. Then, non-critical cells are identified and assigned a lower supply voltage ($V_{ddl}$). As noted hereinabove, interconnect delay can dominate the gate delay for deep submicron circuits and so, power can be reduced for lightly loaded circuits where power is not needed for driving large interconnect loads. So, the global placement information is used to correctly identify the critical versus non-critical cells, e.g., heavily loaded verses lightly loaded. Then in step 156, a logic aware voltage assignment is performed, assigning the lower supply voltage(s) to less critical circuits, i.e., macro, latch and/or cell. Next, in step 158 level converters are inserted and the results are refined and optimized. A level converter is inserted wherever there is a transition net with a low voltage cell driving a high voltage cell or, where a pass gate data input to a low voltage cell or circuit element is being driven by a high voltage cell and being controlled by a low voltage cell. In step 160 isolated assignments are removed in a physical aware voltage reassignment step, locating and reverting solo or very small groups of low voltage circuits that are difficult to form into low voltage islands. Since eliminating those isolated low voltage cells may create opportunities to reassign previously assigned high voltage cells to low voltage cells, in step 162 the design is checked for such opportunities. If any are found, returning to step 156 for another pass the design is further optimized, until there is no improvement available in step 162. Finally, in step 164 placement and power routing patterns are effected based on the voltage island assignments to form the final high and low voltage islands. As result, the entire flow can be tightly integrated with a suitable physical synthesis engine 166 such as a routing tool from Cadence Design Systems, e.g., for application of any necessary further timing optimization.

In addition to identifying circuits for separation into voltage islands, supply high and low voltages may similarly be selected to achieve optimum power saving. Further, a preferred voltage assignment method has application to static and incremental timing engines. Every time a macro or cell is changed from a higher voltage cell to a lower voltage cell, or vice verse, the timing (slack) is updated.

Figure 4A:
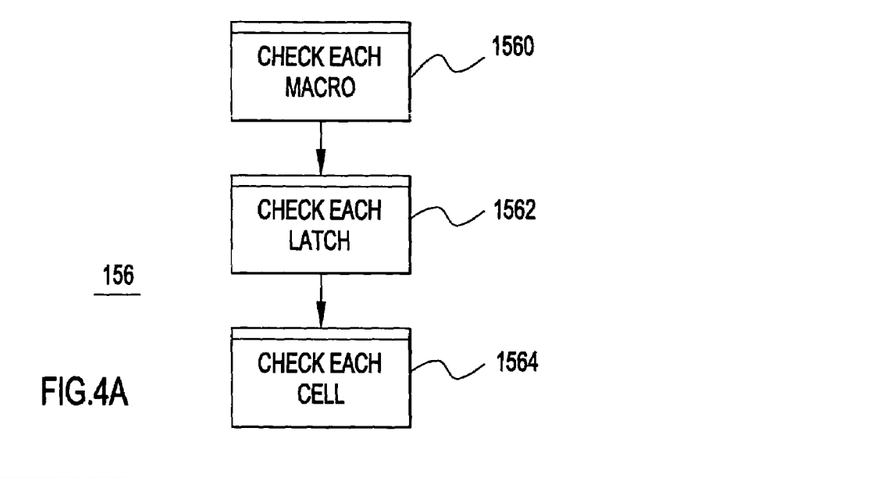
FIGS. 4A–B show an example of the steps in the logic aware voltage assignment.
Figure 4B:
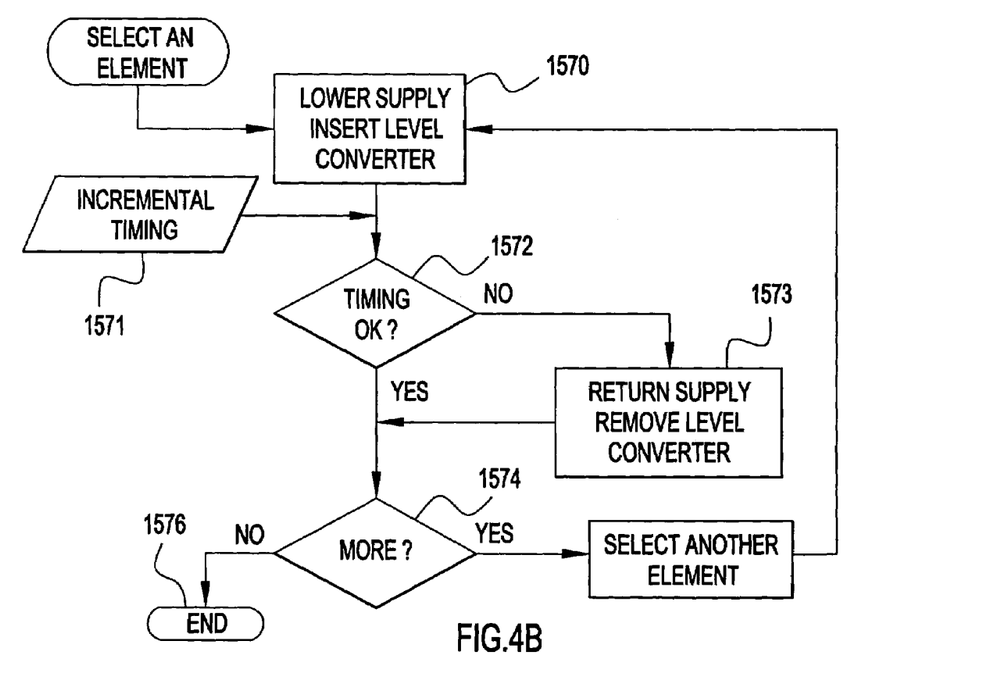

FIGS. 4A–B show an example of the steps in the logic aware voltage assignment step 156 of FIG. 3. Essentially, a logic assessment is done for each macro 1560, latch 1562 and cell 1564 to determine which may be replaced with a low voltage equivalent and level converter, if required. For checking combinational logic cells in step 1564, the cells may be sorted according to timing order from timing end point to timing starting point, i.e., from PO to PI or latch input to latch output. In each major step 1560, 1562 and 1564, each circuit element of each group (macro, latch or cell) is checked, essentially according to the steps 1570–1576 in FIG. 4B to identify low voltage candidates. First in step 1570, the supply to the snacro, latch or cell is reduced and one or more level converters are inserted where appropriate, i.e., at transition nets with low voltage sources driving high voltage sinks. In step 1571 an appropriate incremental timing report is checked for the macro, latch or cell. Then, in step 1572, if the timing specification of the macro, latch or cell is met, it is designated to the low supply voltage. For latches in particular, a latch is designated a low supply latch, if all input pins still have positive slack (i.e., edges arrive at inputs prior to a minimum input set up time) and the output pin slack exceeds a minimum threshold, i.e., for a transitional net the output can accommodate the additional delay for an inserted level converter. Otherwise, in step 1573 it is reverted to the normal, higher supply. In step 1574, if additional macros, latches or cells have not yet been checked; then in step 1575, the next (macro, latch or cell) is selected and returning to step 1570, checking continues. Once, each element of the particular group being checked, i.e., in step 1560, 1562 or 1564, checking proceeds to the next group in 1562 or 1564, respectively, or ends in step 1576. After an initial voltage assignment, the voltage assignment may be further refined, including deleting smaller low voltage supply clusters.

Figure 5A:
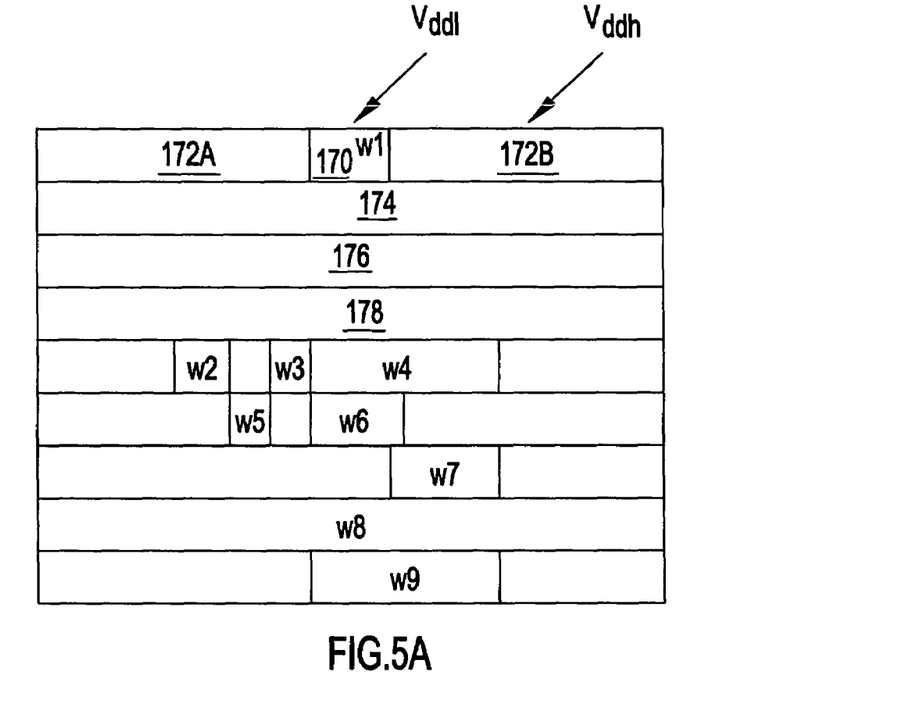
FIGS. 5A–B show an isolated $V_{ddl}$ cell (e.g., width 1 cell) in the middle of a larger $V_{ddh}$ island, optimized by changing such isolated cells back to a $V_{ddh}$ cell.
Figure 5B:
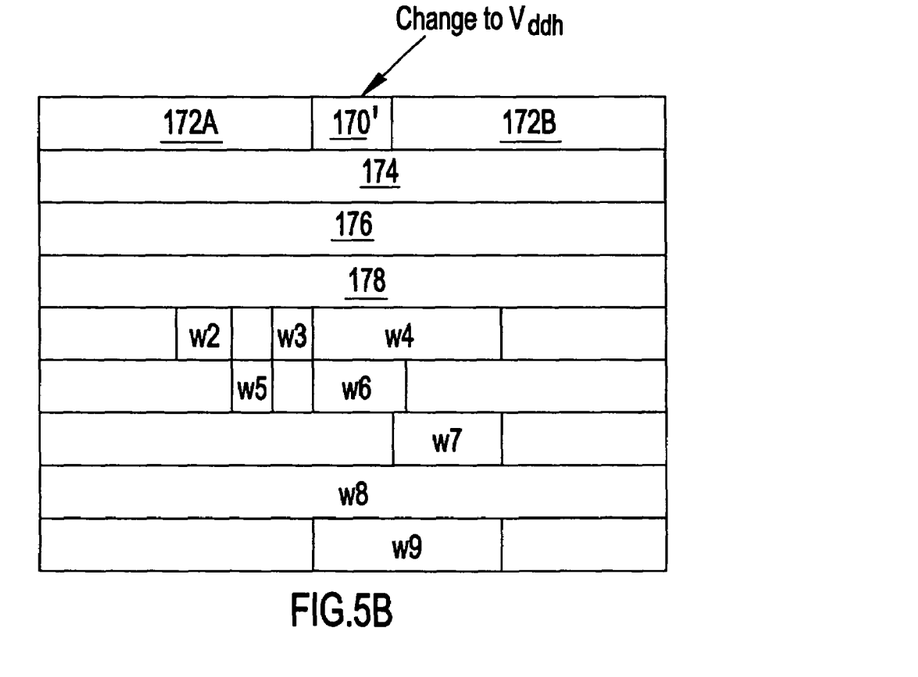

The initial voltage assignment is not physically aware, i.e., no consideration is given to cell placement. As shown in the example of FIG. 5A, it is possible to assign an isolated $V_{ddl}$ cell 170 (e.g., width 1 cell) in the middle of a larger $V_{ddh}$ island, 172A–B, 174, 176, 178. Since such an isolated placement may make it difficult to form uniform voltage islands, an optimum placement is facilitated by changing each such isolated cell 170 back to a $V_{ddh}$ cell 170' as shown in FIG. 5B. It should be noted that initial assignment of these isolated $V_{ddl}$ cells may have prohibited considering other $V_{ddl}$ cells as candidates. Thus, a physical aware voltage reassignment is employed to push more cells to $V_{ddl}$ while minimizing the number of level converters and still meeting the physical timing constraints. So, physical adjacency information is used to facilitate the physical aware voltage reassignment and to guide subsequent voltage assignment.

Physical aware voltage reassignment step 160 in FIG. 3, basically, includes 2 steps. First, a physical adjacency metric (PAM) is computed for the each $V_{ddl}$ cell. The PAM(k, d) for each particular $V_{ddl}$ cell is, the total size (i.e., width) of $V_{ddl}$ cells within the neighboring k rows, including the cell itself, and within diameter range d. Then, all $V_{ddl}$ cells with a PAM less than certain threshold are reverted to $V_{ddh}$ cells. Each reversion may present new opportunities for converting some other $V_{ddh}$ cells that had not been selected in the initial voltage assignment, e.g., due to slack constraints. So, in step 162 of FIG. 3 logic aware voltage assignment is called again with PAM as an additional metric. Only those cells with PAM larger or equal to the selected threshold may be selected as $V_{ddl}$ cells. Thus, the logic aware assignment step 156 and physical aware reassignment step 162 may be iterated until no further improvement is realized.

In each iteration level converter placement is optimized in step 158 to reduce the total number of level converters, gradually deleting the less efficient level converters. Level converters are necessary for transitions between islands, i.e., at least when a $V_{ddl}$ source is driving a $V_{ddh}$ sink. So, for example, branches to those level converters with a small $V_{ddl}$ fanin may be eliminated (deleting the level converter and returning the prior cell with a $V_{ddl}$ cell) or another level converter efficiency metric may be used to select level converters for deletion. Further, since level converters and buffers essentially have the same function and so, can be substituted for buffers, optimizing level converters, simultaneously optimizes buffers. In particular, for any $V_{ddl}$ output driving multiple $V_{ddh}$ inputs (i.e., inputs to multiple $V_{ddh}$ cells), instead of inserting a level converter for each $V_{ddh}$ input, a single level converter is shared, provided that timing and electrical constraints are still met.

Figure 6A:
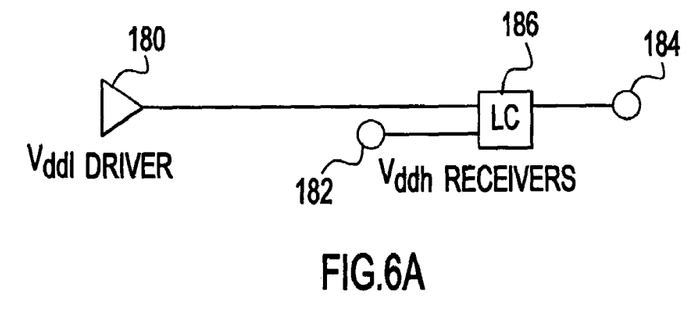
FIGS. 6A–F show before and after level converter placement examples, optimized according to a preferred embodiment of the present invention.
Figure 6B:
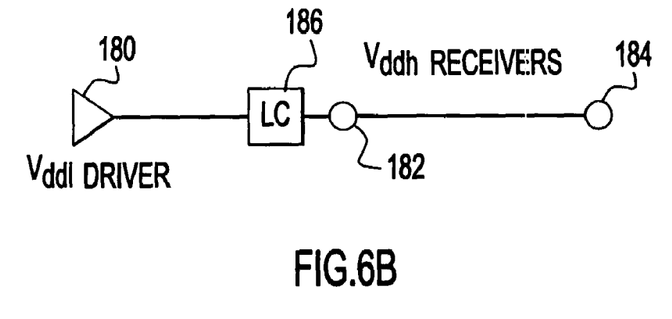

FIGS. 6A–F show before and after level converter placement examples. In the example of FIG. 6A, a $V_{ddl}$ driver 180 is shown driving a transition net with two $V_{ddl}$ receivers 182, 184 aligned in a straight line, where the level converter 186 is at the geometric center of the two receivers 182, 184. However, this placement increases the total wire length because of the detour from the driver 180 to the level converter 186 and, then to the left receiver 182. By contrast, as shown in FIG. 6B, an optimized placement places the level converter 186 just in front of the left receiver 182 to minimize the total net power by maximizing the low voltage net length portion. Thus, power saving may not necessarily decrease the total wire length, but optimizes its apportionment.

Figure 6C:
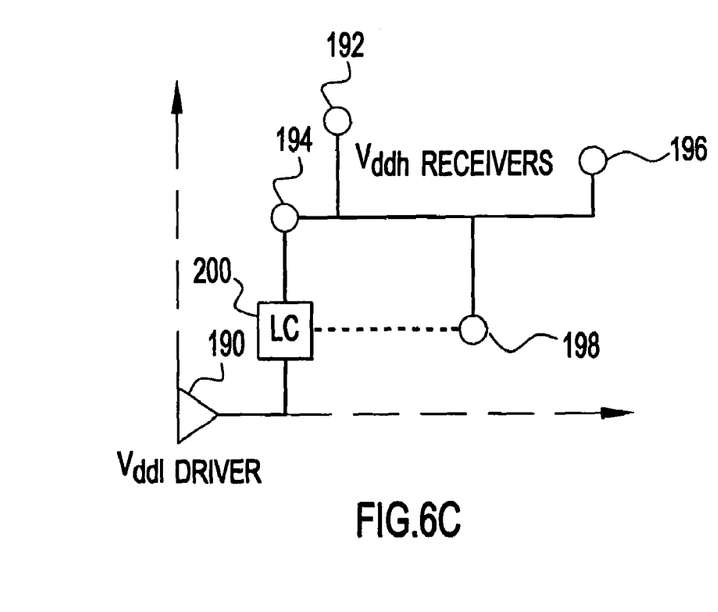
Figure 6D:
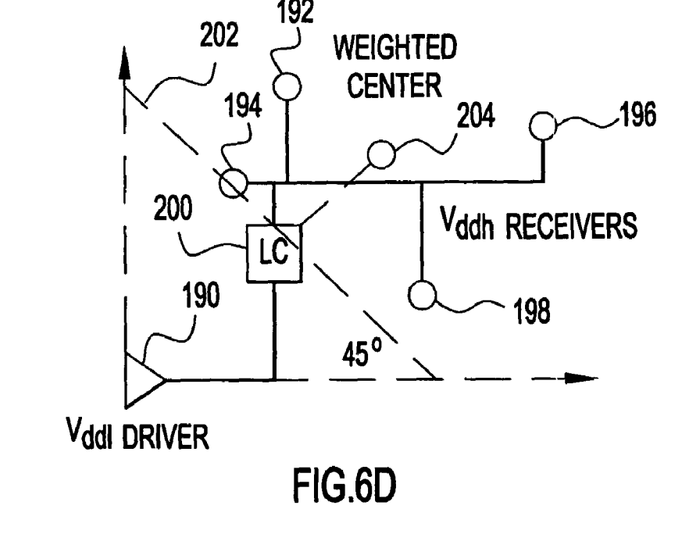

Similarly, as shown in the examples of FIGS. 6C–D, placement can be optimized for a driver 190 driving a transition net with receivers 192, 194, 196, 198 on a two dimensional plane from the driver 190. In this example, the receivers 192, 194, 196, 198 are all located in the first quadrant from the perspective of the driver 190. A common level converter 200 can be shared between $V_{ddl}$ and $V_{ddh}$ interfaces. Preferably, however, the optimum level converter 200 placement is a location to minimize the total wire length; and also, allocates the largest portion of that wire length to the low supply voltage side (i.e., driven by the $V_{ddl}$ driver 190) to minimize switching power, i.e., power expended driving the wire load. Thus, in the example of FIG. 6C the level converter 200 is located a minimum power point at ($X_{min}$, $Y_{min}$), where $X_{min}$ and $Y_{min}$ are the minimum x and y coordinates of all receivers 192, 194, 196, 198. Thus selecting the minimum power point avoids any total wire length increase, but may place the level converter 200 closer to the driver 190. Alternatively, in FIG. 6D the level converter 200 may be placed at the Manhattan distance from the nearest sink (receiver 194 in this example) to the source (on the 45° dotted line 202 in this example). A weighted geometric center 204 may be determined for all the receivers 192, 194, 196, 198 from a delay neutral drive point from the level converter 200. The weight applied for each receiver 192, 194, 196, 198 is a measure of how close the receiver should be to the driver 190 (e.g., the weight may be measured by the slack at each receiver). Then, a projection is determined from the weighted geometric center 204 to the 45° dotted line 202 is performed to determine the level converter location. The weighted center placement more aggressively pushes the level converter 200 further away from the source 190 to increase the total $V_{ddl}$ wire length and thus reduce $V_{ddh}$ wire length, and as a result, minimize power.

Figure 6E:
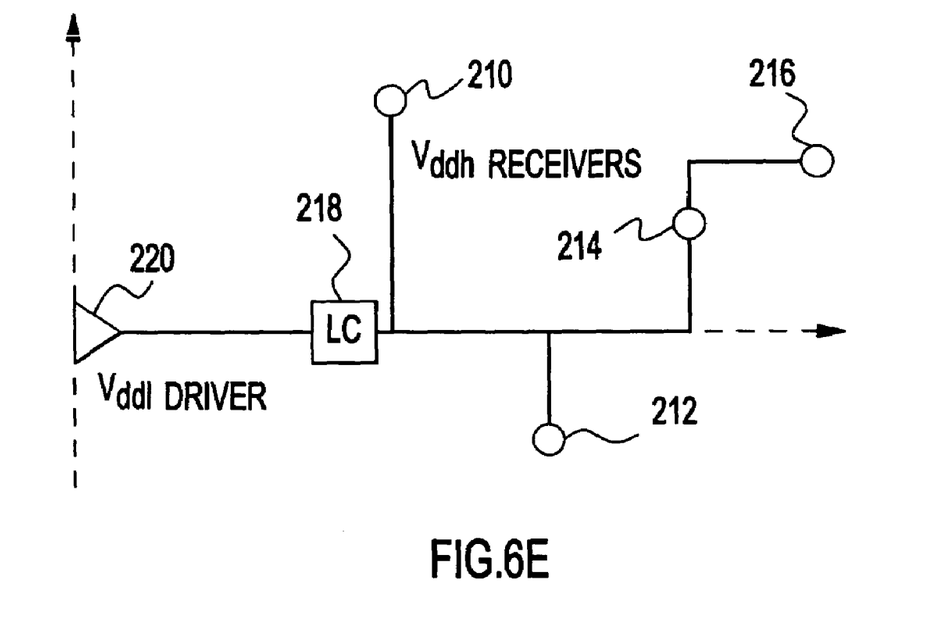
Figure 6F:
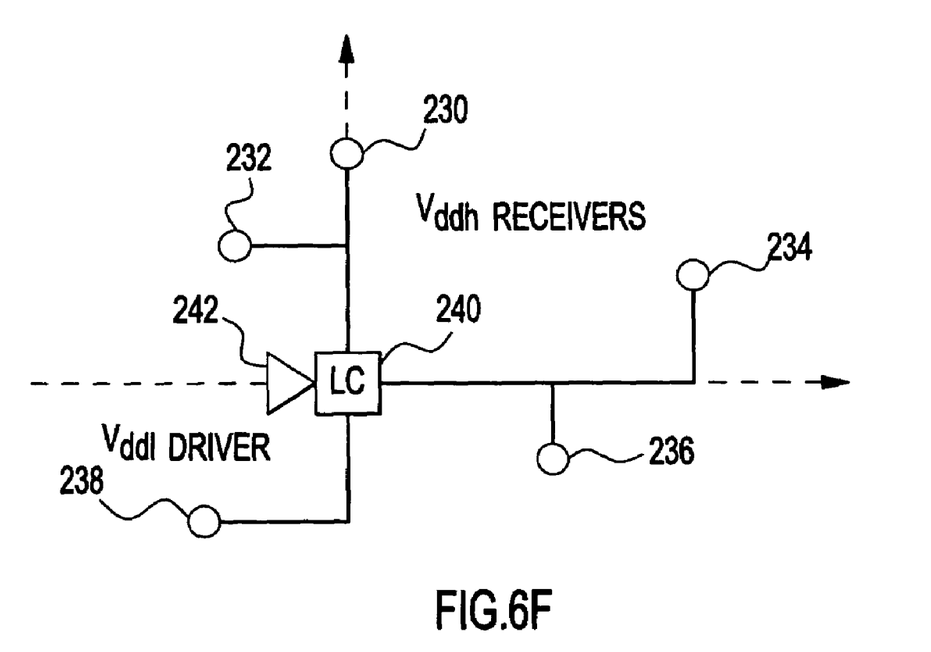

FIGS. 6E–F show after placement examples, wherein $V_{ddh}$ receivers 210, 212, 214, 216 are located in more than just a single quadrant, e.g., they occupy both the first and the fourth quadrant. In this example, the level converter 218 is placed at a side drive point ($X_{min}$, $Y_{drv}$), where $X_{min}$ is the minimum x-coordinate of all receivers, and $Y_{drv}$ is the y-coordinate of the driver 220. Similar drive points can be located for first-second quadrants, second-third quadrants, and third-fourth quadrants. However, if as in the example of FIG. 6F, the receivers 230, 232, 234, 236 238 are dispersed in diagonal quadrants (e.g., first-third quadrants, or second-fourth quadrants), the level converter 240 is placed near the driver 242 because it may not be inserted at any other place without increasing the total wire length.

It should be noted that in all of the above examples, if one level converter 186, 200, 218, 240 is not enough to drive all the respective $V_{ddl}$ receivers, it may be powered up using any suitable technique, e.g., cloning. Whether the level converter is powered up through cloning or otherwise should be evaluated together with the overall power saving of the placement. In particular, the original assignment of $V_{ddl}$ driver may be reverted to $V_{ddh}$ if the level converter cost is higher than the gain by selecting the driver to be $V_{ddl}$ in the first place. Furthermore, level converter placement as described with reference to FIGS. 6A–F is done focusing on total power saving, by minimizing the overall capacitance and $V_{ddh}$ cell load capacitance, while maximizing the $V_{ddl}$ cell load capacitance after level converter placement. However, application of the above described level placement may be done guided by any other selected cost function, such as timing and power supply adjacency, i.e., to deliver proper power supplies to level converters. After the level converter is inserted and placed, a Steiner tree is constructed to connect the level converter with the $V_{ddh}$ receivers.

Figure 7A:
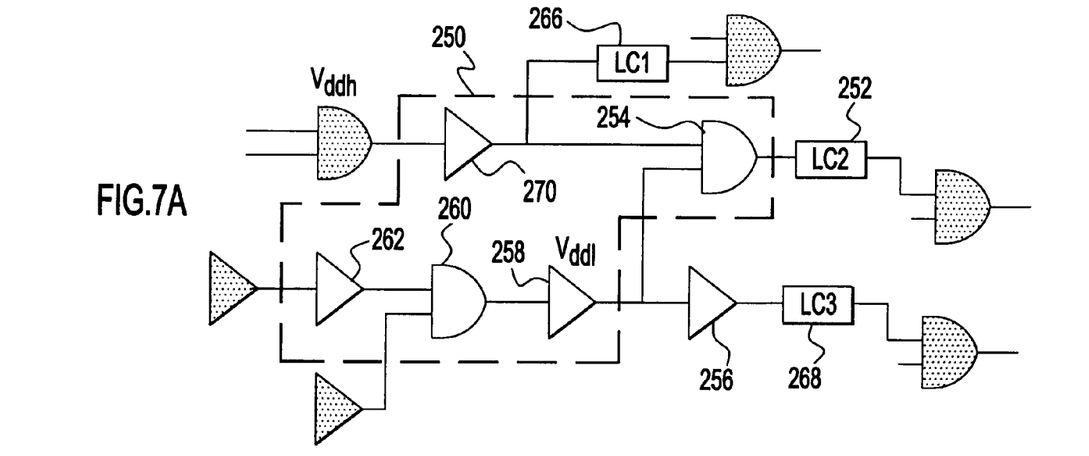
FIGS. 7A–B show an example of a $V_{ddl}$ fanin cone for an iterative level converter optimization.
Figure 7B:
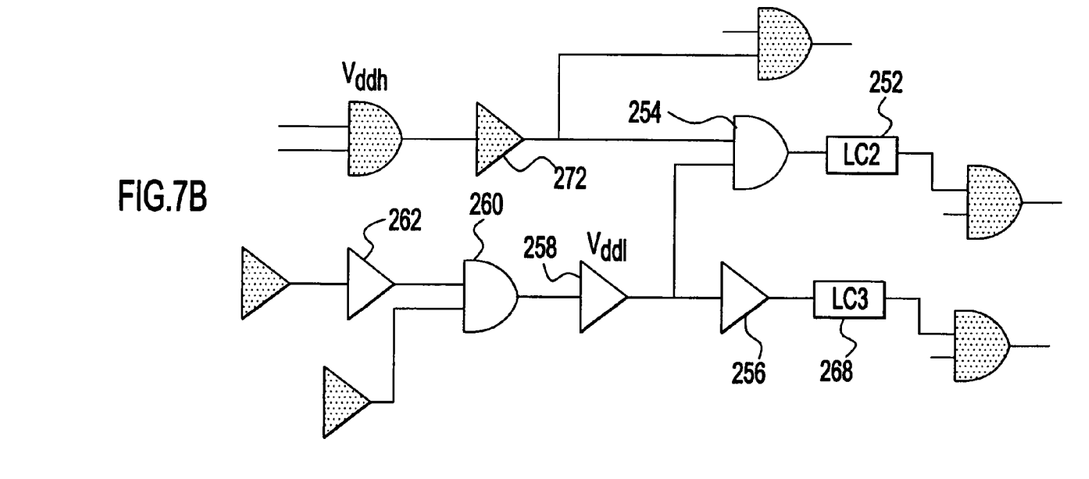

FIGS. 7A–B show an example of an iterative optimization of level converter placement for a $V_{ddl}$ fanin cone 250 according to a preferred embodiment of the present invention. Generally, a fanin cone for level converter includes all gates that drive nets leading to the gate inputs and, as applied to the level converters, signals originating from $V_{ddl}$ gates without crossing/passing through any $V_{ddh}$ gates. As a rule of thumb, the larger the $V_{ddl}$ fanin cone, the more effective the level converter.

In this example the $V_{ddl}$ fanin cone 250 for level converter 252 includes the 5 gates 254, 256, 258, 260, 262. In this example, the size of each $V_{ddl}$ fanin cone for the level converters 252, 266 and 268 is 5, 1 and 4, respectively. However, since each level converter 252, 266, 268 consumes power and chip area, placement is optimized by deleting inefficient level converters. To the first order, the size of $V_{ddl}$ fanin cone is a rough measure of the efficiency of a particular level converter. So, level converters that are inefficient, i.e., level converters with small fanin cones, are deleted. For example, the level converter 266, which has $V_{ddl}$ fanin cone size of one (i.e., only one buffer 270 driving into it) and so, may not be cost effective with respect to power or area. Further, as shown in FIG. 7B after deleting level converter 266 and reverting the single, low voltage input buffer 270 to $V_{ddh}$ buffer 272, the inefficient fanin cone has been eliminated. Also, after deleting level converter 266, the $V_{ddl}$ fanin cones of level converters 252 and 268 are 4 and 4, respectively.

Figure 8:
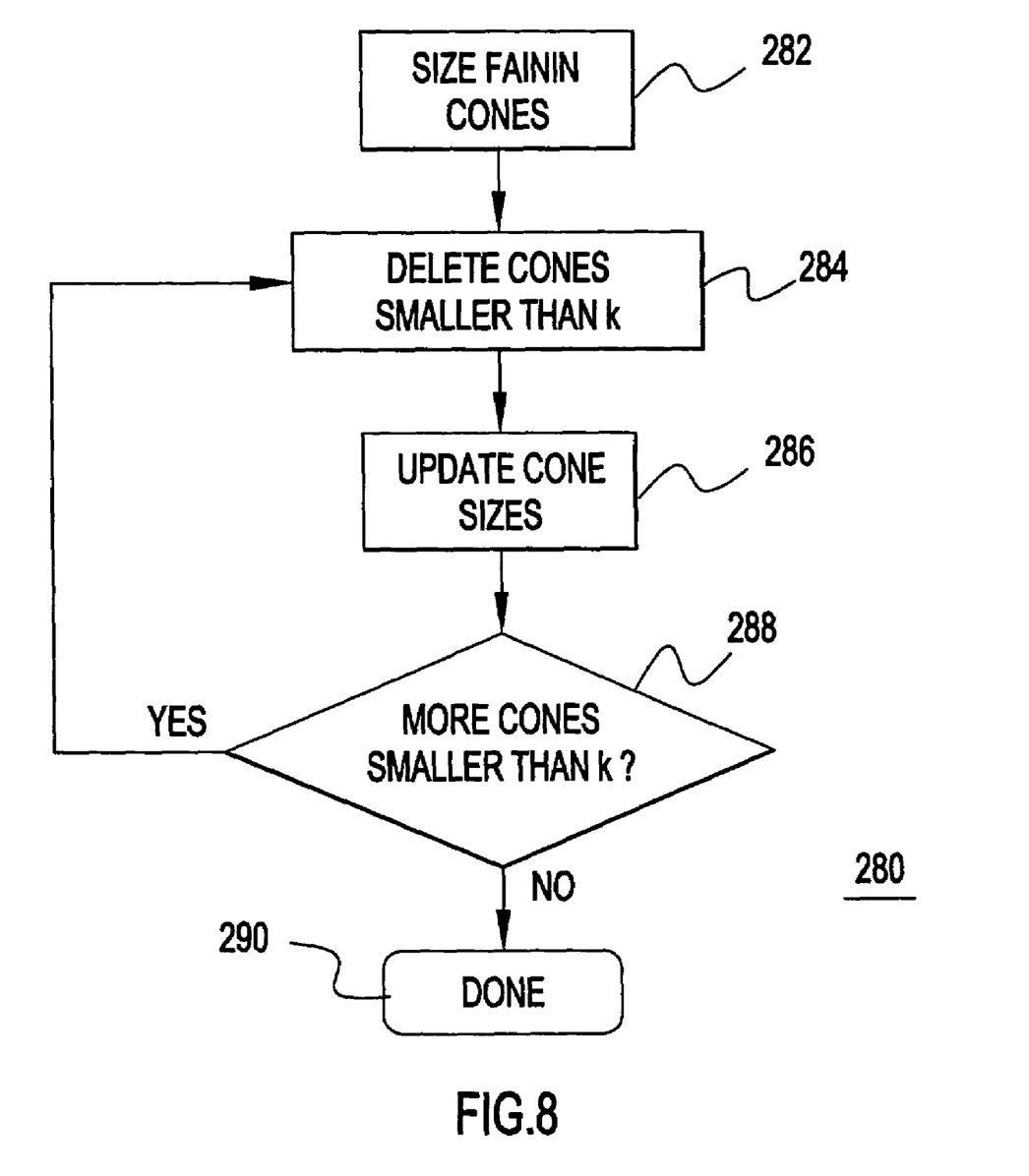
FIG. 8 shows an example of level converter efficiency measurement flow diagram using $V_{ddl}$ fanin cone size to iteratively locate and delete least efficient level converters.

FIG. 8 shows an example of level converter efficiency measurement flow diagram 280 using $V_{ddl}$ fanin cone size to iteratively locate and delete least efficient level converters according to a preferred embodiment of the present invention. First, in step 282 the $V_{ddl}$ fanin cone of each level converter is determined. Then, in step 284 level converters with a fanin having a cone size less than or equal to a selected threshold, k, are converted to $V_{ddl}$ cells. Next in step 286 the $V_{ddl}$ fanin cone size for remaining level converters is updated. In step 288 fanin cones are checked to determine whether more inefficiently placed level converters can be removed, i.e., have a fanin cone size below k. If more fanin cones with a size below k remain, then, returning to step 284, remaining such inefficient level converters are removed, one at a time until none are found in step 288 and optimization ends in step 290. Further, a minimum threshold of $V_{ddl}$ fanin cone size $k_{min}$ may be obtained, incrementally, or a total level converter number upper bound may be incrementally increased to gradually reach an optimum placement. So, the bound may be incrementally increased, gradually removing least efficient level converters, i.e., by setting k=1 first, then k=2, 3, and so on until k=$k_{min}$ or until a selected total level converter number requirement is met. It should be noted also that using $V_{ddl}$ fanin cone size as described herein as a level converter efficiency metric is for example only and not intended as a limitation. Any other measurement metric may be employed to iteratively select and delete less efficient level converters.

Figure 9A:
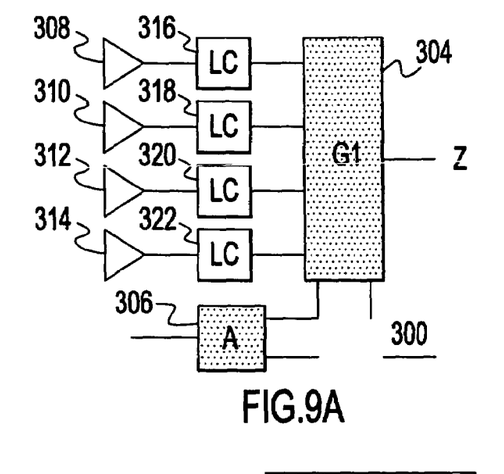
FIGS. 9A–B show before and after examples of level converter optimization effected with logic replacement.
Figure 9B:
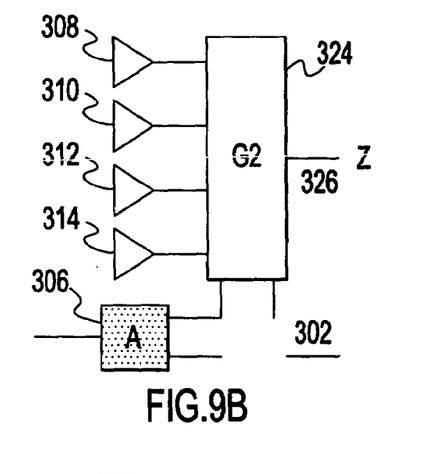

FIGS. 9A–B show before and after examples, 300, 302, respectively, of level converter placement optimization effected with logic replacement, i.e., replacing selected $V_{ddh}$ gates with its $V_{ddl}$ counterparts (possibly using a different size in the library) to reduce the number of level converters. In particular, this is effective for those $V_{ddh}$ gates that have many fanin signals originating with level converters. So for example, in before circuit 300 gate 304 is assigned to $V_{ddh}$, because it is timing critical due to another input from a $V_{ddh}$ gate 306. The gate 304 receives its four other inputs from gates 308, 310, 312, 314 that are all $V_{ddl}$ cells and so, require insertion of four level converters 316, 318, 320, 322. Thus, in optimized circuit 302, gate 304 is replaced with a functionally equivalent $V_{ddl}$ gate 324 and, typically, a level converter (not shown) is inserted at output 326. In addition, the replacement $V_{ddl}$ gate 324 may be of a different drive strength. However, the number of level converters may be significantly reduced by such replacement.

Figure 10:
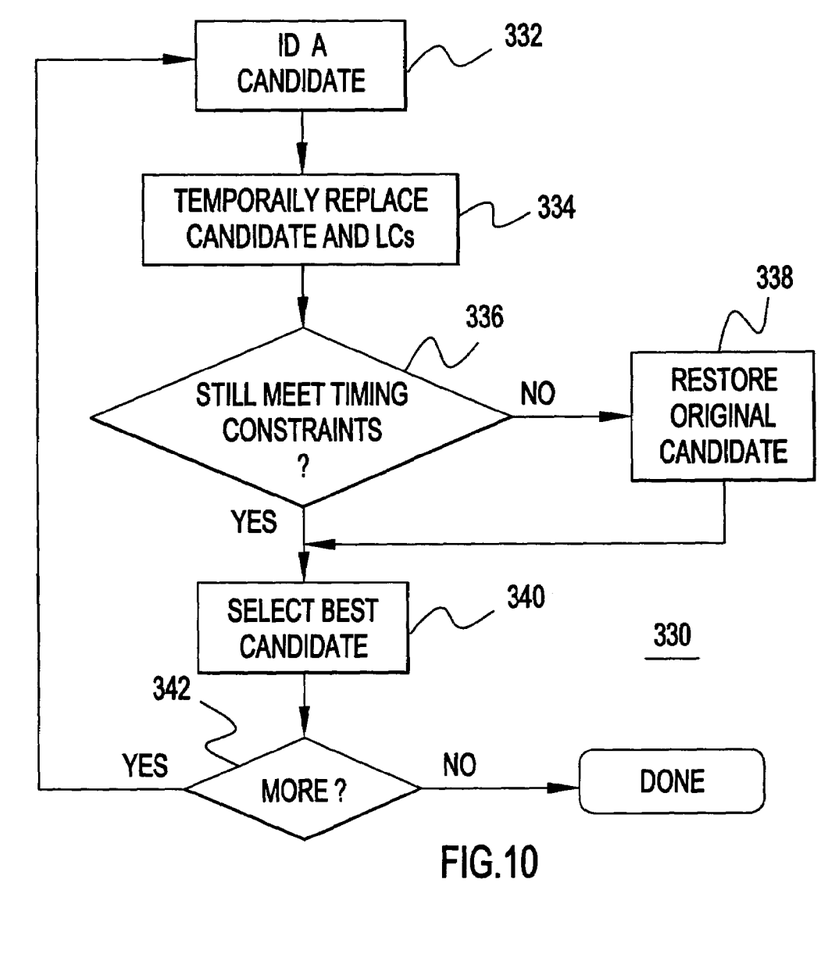
FIG. 10 shows a flow diagram showing an example of the logic replacement.

FIG. 10 shows a flow diagram showing an example of the logic replacement step 330 according to a preferred embodiment of the present invention. First, in step 332 a $V_{ddh}$ gate candidate with multiple input level converters is identified. Then, in step 334 the selected $V_{ddh}$ gate is temporarily replaced with its $V_{ddl}$ equivalent. Unnecessary level converters are deleted from the inputs to the replaced gate and, if necessary, a level converter is inserted at the gate output. Then in step 336, the timing constraint is checked to determine if it is still met. Optionally, step 334 may be repeated, trying different $V_{ddl}$ gate sizes and selecting the best result for timing/power. If timing is met in step 336, then the logic replacement with the most power saving is selected in step 338. Otherwise, in step 340 the previous (original) solution is restored. In step 342 the logic is checked to determine if more $V_{ddh}$ candidates remain. If so returning to step 322 the next $V_{ddh}$ candidate is selected, until in step 342 no candidates remain and so, all candidate $V_{ddh}$ gates with multiple level converters in its inputs are checked.

Figure 11A:
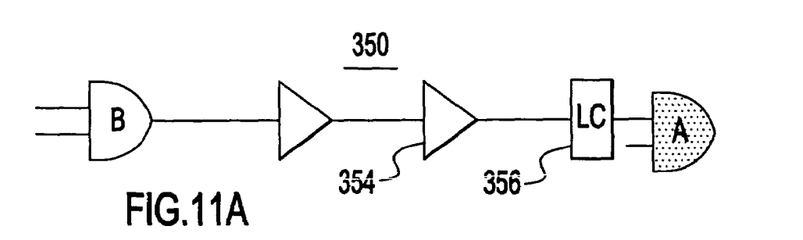
FIGS. 11A–B show before and after examples of replacing a buffer and level converter with a single level converter and adjusting placement to meet design objectives.
Figure 11B:
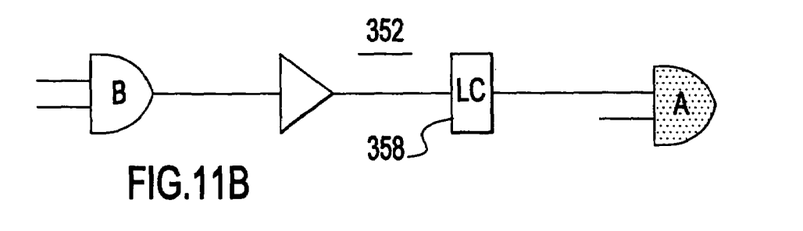

FIGS. 11A–B show before and after examples 350, 352, wherein a buffer 354 and level converter 356 are replaced, with a single level converter 358 and placement is adjusted to meet design objectives. As noted hereinabove, since each level converter is itself a buffer, level converters can be substituted for traditional buffers, e.g., as signal relays to break long interconnects and restore/redrive signals, thereby reducing buffers or chains of inverters.

Figure 12:
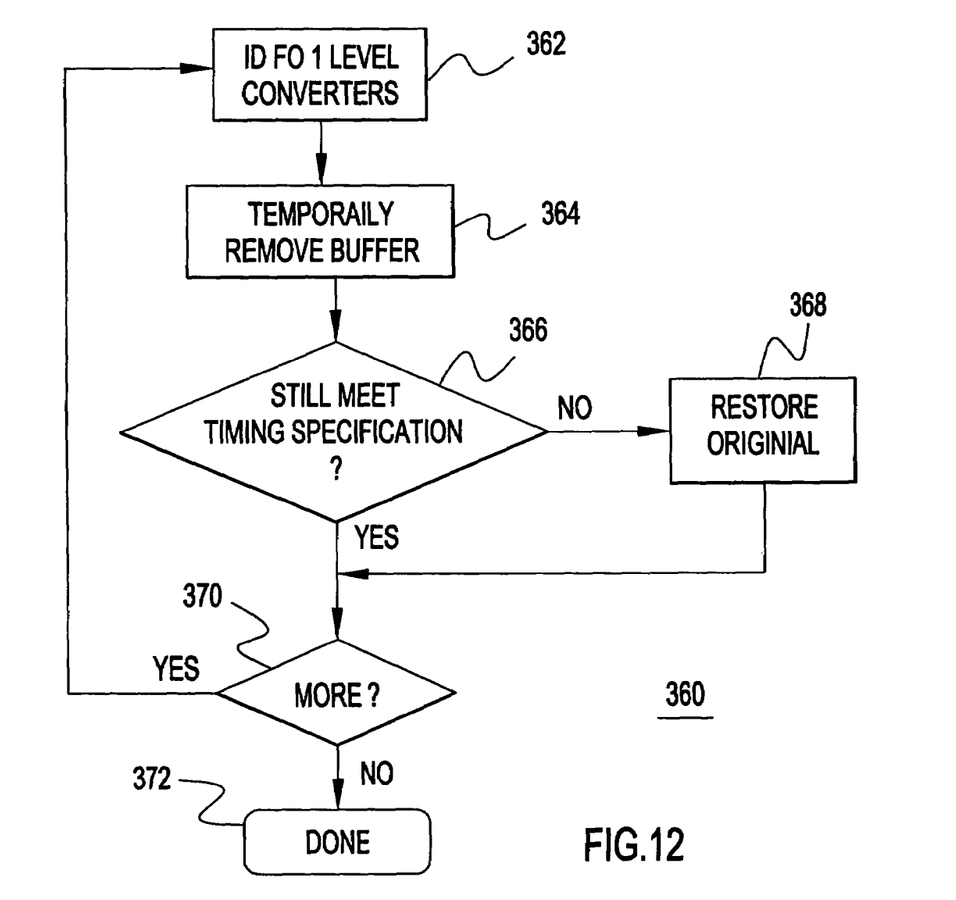
FIG. 12 shows a flow diagram for identifying paired level converters and buffers for optimization.

FIG. 12 shows a flow diagram 360 for identifying paired level converters and buffers for optimization. First in step 362, a each level converter is identified with at least one buffer immediately before it with fanout 1 (FO1). If such a level converter is identified, then in step 364 the buffer is temporarily removed, and the level converter placement is adjusted as described hereinabove. Then in step 366, the timing specification is checked and, if still met, the buffer is permanently removed. Otherwise, in step 368, the original placement is restored. Then, in step 370 the remaining buffers are checked for more candidates and, if one is found, returning to step 364, that candidate is checked. Otherwise, checking ends in step 372.

A design may be constrained wherein portions may not be modified, e.g., with input/output (I/O) constraints that may not be replaced, for example, with $V_{ddl}$ cells. For example in a microprocessor core design, placing slower $V_{ddl}$ cells at the input logic between primary chip input and the first level latches, as well as at the output logic between the final level latches and the primary chip outputs may be unacceptable. Such constrained logic can be hidden or removed from consideration to avoid changing those cells to $V_{ddl}$ cells. Also, a user may specify a supply voltage for a set or sets of cells or macros. Such constraint information can be passed to voltage assignment with those constrained cells marked as hidden and so, not touched. Also, circuitry related constraints, can be applied during voltage assignment.

Advantageously, the present invention provides a flexible, systematic method for identifying cell candidates and creating optimized voltage islands. Further, such a design is achieved with a fine-grained voltage island and without performance degradation. Additionally, voltage assignment is both logically and physically, honoring both logic and physical adjacencies. Level converters are efficiently optimized for the design.

While the invention has been described in terms of preferred embodiments, those skilled in the art will recognize that the invention can be practiced with modification within the spirit and scope of the appended claims.

What is claimed is:

1. A method of optimizing level converter placement in a multi supply design placement, said method comprising the steps of:
   a) locating minimum power points in a placed multi supply design, each minimum power point being located to minimize net power and transitional delay, transitional delay being a first voltage net delay to said level converter, through said level converter and a second voltage net delay from a level converter at said each minimum power point; and
   b) eliminating inefficient level converters.

2. A method as in claim 1, wherein at least one said minimum power point is located at a geometric center between a pair of sinks on a corresponding second voltage net.

3. A method as in claim 1, wherein at least one first voltage net originates at a first quadrant and a corresponding second voltage net connects to a plurality of sinks in a second quadrant and said minimum power point is located at minimum horizontal (x) and vertical (y) coordinates of said plurality of sinks.

4. A method as in claim 1, wherein at least one first voltage net originates at a first quadrant and a corresponding second voltage net connects to a plurality of sinks in a second quadrant and wherein said minimum power point is located comprising the steps of:
   A) locating a weighted center of said plurality of sinks; and
   B) providing a projection from said weighted geometric center to a baseline intersecting one of said plurality of sinks.

5. A method as in claim 4 wherein said baseline is on a diagonal with axes of said second quadrant and said intersecting one is closest to said axes.

6. A method as in claim 4 wherein locating said minimum power point further comprises finding a location on said baseline at a Manhattan distance from a closest one of said plurality of sinks to a source driving said first voltage net.

7. A method as in claim 1, wherein at least one first voltage net originates at a first quadrant and a corresponding second voltage net connects to a plurality of sinks in a second quadrant and third quadrant and said minimum power point is located at a side drive point.

8. A method as in claim 7, wherein said second quadrant and said third quadrant are on one side of an axis, at least one of said plurality of sinks being at a least distance from said axis and said side drive point being located at said least distance directly across said axis front a driver driving said at least one first voltage net.

9. A method as in claim 1, wherein at least one first voltage net originates at a first quadrant and a corresponding second voltage net connects to a plurality of sinks in a second quadrant and third quadrant and said minimum power point is located at a source driving said first voltage net.

10. A method as in claim 1, wherein at said minimum power point is selected to minimize wiring.

11. A method as in claim 1 wherein the step (b) of eliminating inefficient level converters comprises eliminating level converter fanin cones below a selected minimum cone size.

12. A method as in claim 1 wherein the step (b) of eliminating inefficient level converters comprises the steps of:
 i) defining fanin cones for each of said level converters;
 ii) reverting first voltage level nets in fanin cones below a selected minimum fanin size.

13. A method as in claim 12, wherein the step (ii) of reverting voltage level nets comprises:
 A) selecting a smallest fanin cone size;
 B) reverting said first voltage level nets having said smallest fanin cone size;
 C) re-defining said fanin cones; and
 D) returning to step (A) until said smallest fanin cone size selected in step (A) is said selected minimum fanin cone size.

14. A method as in claim 1 wherein the step (b) of eliminating inefficient level converters comprises the steps of:
 i) identifying second voltage level circuit elements receiving inputs from at least two of said level converters;
 ii) converting selected ones of said second voltage circuit elements to an equivalent first voltage circuit element;
 iii) deleting said at least two level converters; and
 iv) inserting a level converter at each output of said equivalent first voltage circuit element.

15. A method as in claim 14, wherein said second voltage circuit elements are selected in step (ii) by checking timing through said equivalent first voltage circuit element and said level converter at each output.

16. A method as in claim 1, wherein the step (b) of eliminating inefficient level converters comprises selectively replacing first voltage level buffer and level converter pairs with a single said level converter, said pairs being one said first voltage level buffer driving a corresponding said level converter.

17. A method as in claim 16, wherein said pairs are selected by checking timing through said single level converter.

18. A method as in claim 1, wherein step (a) further comprises placing and wiring said multi supply design and an input netlist, technology definition and timing constraints are provided for placing and wiring.

19. A method of optimizing level converter placement in a multi supply integrated circuit design, said method comprising the steps of:
 a) providing an input netlist, technology definition and timing constraints for a circuit design;
 b) selectively placing level converters to minimize net power and transitional delay in said circuit design, each of said level converters being placed at a corresponding minimum power point, transitional delay being a first voltage net delay to a level converter, through said level converter and a second voltage net delay from said level converter;
 c) eliminating level converter fanin cones for corresponding said level converters below a selected minimum cone size;
 d) converting selected second voltage level circuit elements receiving inputs from at least two of said level converters to an equivalent first voltage circuit element; and
 e) selectively replacing first voltage level buffer and level converter pairs with a single said level converter, said pairs being one said first voltage level buffer driving a corresponding said level converter.

20. A method as in claim 19, wherein selectively placing said level converters in step (b) comprises:
 i) identifying ones of said level converters driving pairs of sinks on a corresponding second voltage net and locating said minimum power point for said pair at a geometric center between said pair;
 ii) identifying first voltage nets originating at a first quadrant with corresponding second voltage nets connecting to a plurality of sinks in a second quadrant and locating said minimum power point in said second quadrant; and
 iii) identifying said first voltage nets originating at a first quadrant with a corresponding second voltage net connecting to a plurality of sinks in a second quadrant and third quadrant and locating said minimum power point with said sinks.

21. A method as in claim 20, wherein said minimum power point is located in step (ii) at minimum horizontal (x) and vertical (y) coordinates of said plurality of sinks.

22. A method as in claim 20, wherein said minimum power point is located in step (ii) comprising the steps of:
 A) locating a weighted center of said plurality of sinks; and
 B) providing a projection from said weighted geometric center to a baseline intersecting one of said plurality of sinks.

23. A method as in claim 22, wherein said baseline is on a diagonal with axes of said second quadrant and said intersecting one is closest to said axes.

24. A method as in claim 22, wherein locating said minimum power point further comprises finding a location on said baseline at a Manhattan distance from a closest one of said plurality of sinks to a source driving said first voltage net.

25. A method as in claim 20, wherein said minimum power point is located in step (iii) at a side drive point.

26. A method as in claim 25, wherein locating said side drive point comprises:
 A) locating an axis between a driver driving a transitional net and sinks on said transitional net;
 B) locating at least one of said sinks at a least distance from said axis; and
 C) locating a point at said least distance directly across said axis from said source driver.

27. A method as in claim 20, wherein said minimum power point is located in step (iii) at a source driving said first voltage net.

28. A method as in claim 19, wherein the step (c) of deleting fanin cones comprises the steps of:
  i) defining fanin cones for each of said level converters; and
  ii) reverting first voltage level nets in fanin cones below a selected minimum fanin size.

29. A method as in claim 28, wherein the step (ii) of reverting voltage level nets comprises:
  A) selecting a smallest fanin cone size;
  B) reverting said first voltage level nets having said smallest fanin cone size;
  C) re-defining said fanin cones; and
  D) returning to step (A) until said smallest fanin cone size selected in step (A) is said selected minimum fanin cone size.

30. A method as in cLaim 19, wherein said second voltage circuit elements are selected in step (d) by checking timing through said equivalent first voltage circuit element and said level converters placed at each output.

31. A computer program product for optimizing level converter placement in a multi supply integrated circuit (IC) design, said computer program product comprising a computer usable medium having computer readable program code thereon, said computer readable program code comprising:
  computer program code means for locating minimum power points in a placed multi supply design, each minimum power point minimizing power and transitional delay for a level converter placed at said each minimum power point, transitional delay being a first voltage net delay to said level converter, through said level converter and a second voltage net delay from said level converters;
  computer program code means for placing level converters at minimum power points; and
  computer program code means for eliminating inefficient said level converters.

32. A computer program product as in claim 31, wherein the computer program code means for locating said minimum power point comprises:
  computer program code means for locating a geometric center of a plurality of circuit sink elements on a net;
  computer program code means for locating a weighted center of said plurality of circuit sink elements on said net; and
  computer program code means for determining bounds for said plurality of circuit sink elements on said net.

33. A computer program product as in claim 32, wherein the computer program code means for locating said minimum power point further comprises:
  computer program code means for providing a projection from said weighted geometric center to a baseline intersecting one of said plurality of sinks.

34. A computer program product as in claim 33, wherein the computer program code means for locating said minimum power point further comprises:
  computer program code means for finding a location at a Manhattan distance from a closest one of said plurality of sinks to a source driving said first voltage net.

35. A computer program product as in claim 31, the computer program code means for eliminating inefficient level converters comprising:
  computer program code means for identifying and eliminating level converter fanin cones for corresponding said level converters below a selected minimum cone size;
  computer program code means for identifying and converting selected second voltage level circuit elements receiving inputs from at least two of said level converters to an equivalent first voltage circuit element; and
  computer program code means for selectively replacing first voltage level buffer and level converter pairs with a single said level converter, said pairs being one said first voltage level buffer driving a corresponding said level converter.

36. A computer program product as in claim 35, wherein the computer program code means for identifying and deleting fanin cones comprises:
  computer program code means for reverting first voltage level nets in fanin cones below a selected minimum fanin size.

37. A computer program product as in claim 35, wherein the computer program code means for reverting voltage level nets comprises:
  computer program code means for selecting a smallest fanin cone size;
  computer program code means for reverting said first voltage level nets having said smallest fanin cone size; and
  computer program code means for re-defining said fanin cones.

38. A computer program product as in claim 31 further comprising:
  computer program code means for receiving an input netlist, technology definition and timing constraints.

* * * * *